(12) United States Patent
Rong

(10) Patent No.: US 8,269,318 B2
(45) Date of Patent: Sep. 18, 2012

(54) MOS DEVICE

(75) Inventor: Chun Rong, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 95 days.

(21) Appl. No.: 12/772,241

(22) Filed: May 3, 2010

(65) Prior Publication Data

US 2011/0266636 A1 Nov. 3, 2011

(51) Int. Cl.
*H01L 23/58* (2006.01)
(52) U.S. Cl. ............ 257/649; 257/288; 257/E21.229; 257/E21.245; 257/E21.293; 257/E21.227; 257/E21.267; 257/E21.278; 257/E21.435
(58) Field of Classification Search ............... 257/204, 257/288, 334, 336, 649, E21.229, E21.245, 257/E21.293, E21.278, E21.267, E21.227, 257/E21.435
See application file for complete search history.

(56) References Cited

U.S. PATENT DOCUMENTS

| | | | |
|---|---|---|---|
| 6,632,745 B1 * | 10/2003 | Yap et al. | 438/696 |
| 6,706,601 B1 | 3/2004 | Liu | |
| 6,900,104 B1 | 5/2005 | Chen | |
| 7,517,766 B2 * | 4/2009 | Chou et al. | 438/303 |
| 2003/0011017 A1 | 1/2003 | Lee | |
| 2004/0212095 A1 * | 10/2004 | Ferreira et al. | 257/774 |
| 2005/0227468 A1 | 10/2005 | Chen | |
| 2008/0064176 A1 | 3/2008 | Chou | |

FOREIGN PATENT DOCUMENTS

TW I314349 B 9/2009

* cited by examiner

*Primary Examiner* — David Nhu
(74) *Attorney, Agent, or Firm* — Winston Hsu; Scott Margo

(57) ABSTRACT

A method for forming an offset spacer of a MOS device is disclosed. The method includes the steps of: providing a substrate having a gate structure thereon; forming a dielectric stack on the substrate and the gate structure, wherein the dielectric stack includes a first dielectric layer, a second dielectric layer, a third dielectric layer, and a fourth dielectric layer; and performing an etching process on the dielectric stack to form an offset spacer around the gate structure.

4 Claims, 2 Drawing Sheets

MOS DEVICE

BACKGROUND OF THE INVENTION

1. Field of the Invention

The invention relates to a method for forming an offset spacer of a metal-oxide semiconductor (MOS) device.

2. Description of the Prior Art

As MOSFET and CMOS device characteristic sizes are scaled below 0.13 microns including below 0.1 micron, the process window for wet and dry etching processes are increasingly difficult to control to achieve desired critical dimensions. For example, in forming dielectric offset spacers, also referred to as sidewall spacers, the required width of the offset spacer is increasingly smaller. For example, the width of the offset spacer may be as small as 100 Angstroms (10 nanometers) or less in 65 nanometer characteristic dimensioned CMOS devices.

The offset spacer dielectric is formed adjacent either side of the gate structure and serves to allow the formation of source/drain extensions (SDE) or lightly doped drains (LDD). For instance, after the offset spacer is formed on the sidewall of the gate structure, a relatively lower amount of N or P-type doping is formed in the substrate adjacent to two sides of the offset spacer for forming lightly doped drain.

Offset spacer formation typically requires both deposition and etching processes, for example, to first deposit a single silicon oxide layer or a composite layer of a silicon oxide layer and a silicon nitride layer and subsequently remove portions of the deposited silicon oxide or silicon nitride layers. In conventional approach, the removal of portions of the deposited silicon oxide or silicon nitride layers is usually accomplished by a dry etching process, such as a plasma etching. However, plasma charging from the dry etching process not only penetrates the gate electrode to damage the gate oxide underneath, but also induces a silicon loss in the substrate adjacent to two sides of the offset spacer. It is therefore desirable to come up with a novel fabrication for improving the drawback caused by conventional approach.

SUMMARY OF THE INVENTION

It is therefore among the objects of the present invention to provide an improved method for dielectric offset spacer formation to overcome the shortcomings of the prior art.

According to a preferred embodiment of the present invention, a method for forming an offset spacer of a MOS device is disclosed. The method includes the steps of: providing a substrate having a gate structure thereon; forming a dielectric stack on the substrate and the gate structure, wherein the dielectric stack comprises a first dielectric layer, a second dielectric layer, a third dielectric layer, and a fourth dielectric layer; and performing an etching process on the dielectric stack to form an offset spacer around the gate structure.

According to another aspect of the present invention, a method for forming an offset spacer of a MOS device is disclosed. The method includes the steps of: providing a substrate having a gate structure thereon; forming a dielectric stack on the substrate and the gate structure, wherein the dielectric stack comprises a first dielectric layer, a second dielectric layer, a third dielectric layer, and a fourth dielectric layer; performing a first etching process for removing a portion of the fourth dielectric layer; performing a second etching process for removing a portion of the third dielectric layer; and performing a third etching process for removing a portion of the second dielectric layer for forming an offset spacer around the gate structure.

It is another aspect of the present invention to provide a metal-oxide semiconductor (MOS) device. The MOS device includes: a substrate; a gate structure disposed on the substrate; an offset spacer disposed around the gate structure, wherein the offset spacer comprises a ONO stack and a silicon nitride spacer sitting on the ONO stack; and a lightly doped drain disposed in the substrate adjacent to two sides of the offset spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
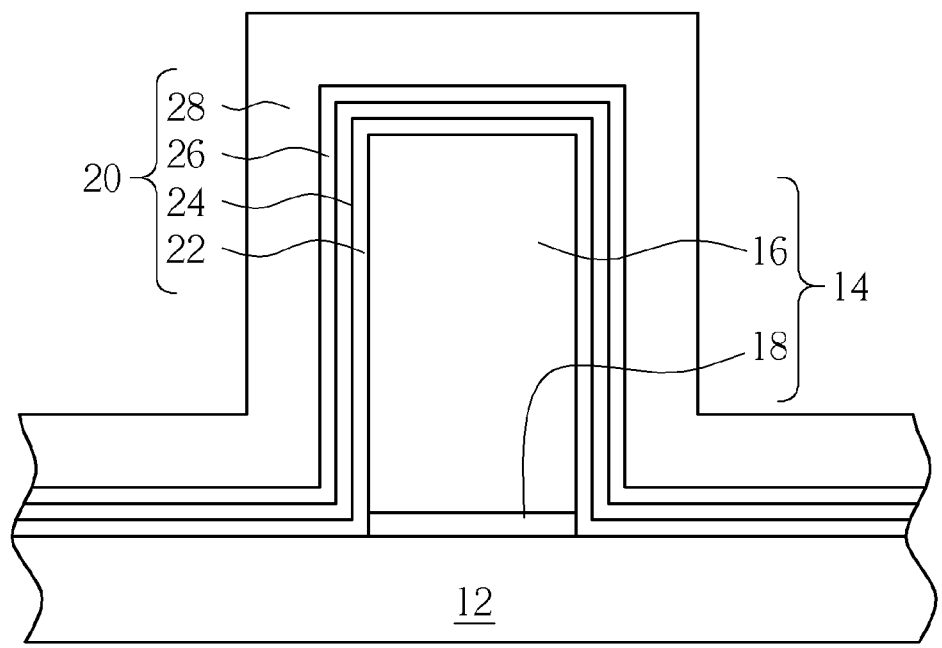
FIGS. 1-4 illustrate a method for fabricating an offset spacer of a MOS device according to a preferred embodiment of the present invention.

Referring to FIGS. 1-4, FIGS. 1-4 illustrate a method for fabricating an offset spacer of a MOS device according to a preferred embodiment of the present invention. As shown in FIG. 1, a substrate 12, such as a silicon substrate or a silicon-on-insulator substrate is provided.

A gate insulating layer (not shown) and a polysilicon layer (not shown) are deposited sequentially on the substrate. The gate insulating layer is preferably composed of dielectric material such as oxides or nitrides, and the polysilicon layer is composed of undoped polysilicon or polysilicon having dopants therein, which are all within the scope of the present invention.

A photo-etching process is then conducted by first forming a patterned photoresist (not shown) on the polysilicon layer, and an etching process is carried out by using the patterned photoresist as mask to remove a portion of the polysilicon layer and the gate insulating layer for forming a gate structure 14 composed of patterned polysilicon layer 16 and patterned gate insulating layer 18.

Next, a dielectric stack 20 preferably composed of a first dielectric layer 22, a second dielectric layer 24, a third dielectric layer 26, and a fourth dielectric layer 28 is formed on the substrate 12 and the gate structure 14. In this embodiment, the four dielectric layers of the dielectric stack 20 are deposited in-situly and the dielectric stack 20 is preferably an oxide-nitride-oxide-nitride (ONON) dielectric stack. Hence, the first dielectric layer 22 is composed of silicon oxide, the second dielectric layer 24 is composed of silicon nitride, the third dielectric layer 26 is composed of silicon oxide, and the fourth dielectric layer 28 is composed of silicon nitride.

Figure 2:
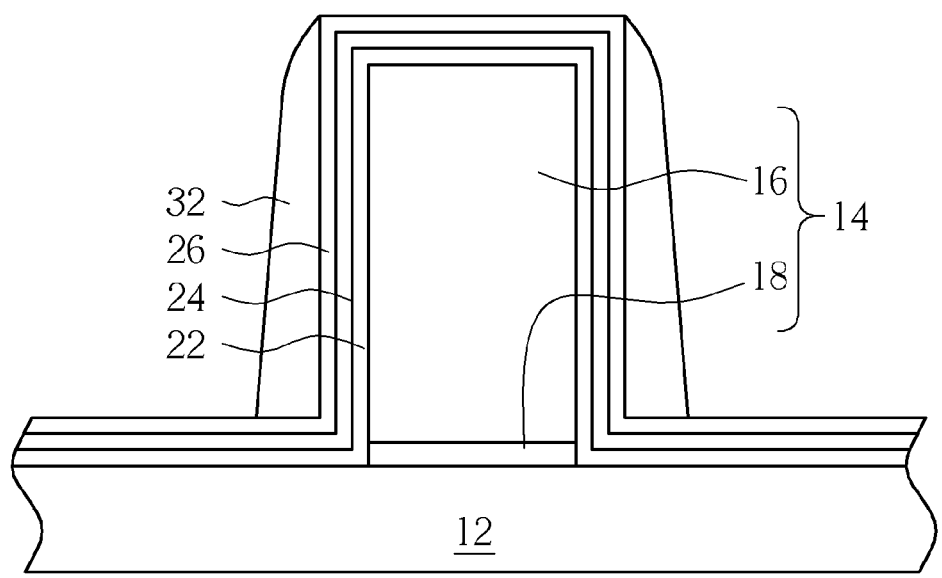

As shown in FIG. 2, a dry etching process is performed by removing a portion of the fourth dielectric layer 28, such as the top silicon nitride layer of the ONON dielectric stack 20 for forming a silicon nitride spacer 32. The dry etching process is controlled to have a high selectivity on SiN/SiO such that the dry etching would partially remove the fourth dielectric layer 28 composed of silicon nitride and stop at the third dielectric layer 26 composed of silicon oxide underneath. In this embodiment, the dry etching process is preferably a plasma etching process, and the dry etching preferably removes the fourth dielectric layer 28 disposed on top of the gate structure 14 and a portion of the fourth dielectric layer 28 disposed on the substrate 12 while the rest of the fourth dielectric layer is remained on the sidewall of the gate structure 14.

As the ONO stack disposed under the fourth dielectric layer 28 during the plasma etching approach preferably has a thickness between 50 Angstroms to 70 Angstroms, charging from the plasma etching step is preferably blocked by the ONO stack for protecting the gate insulating layer 18 underneath as a portion of the top silicon nitride layer 28 is removed.

Figure 3:
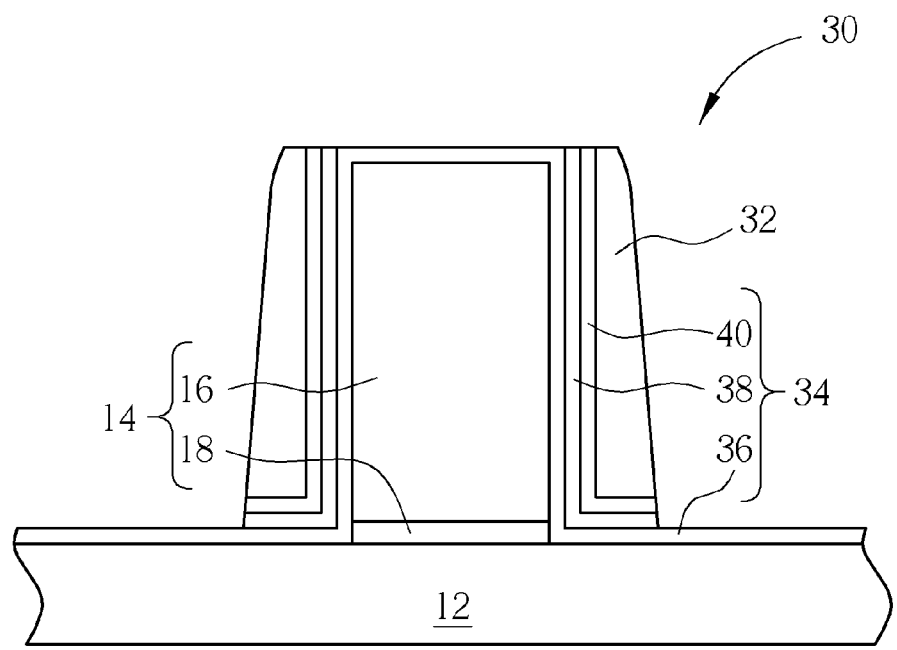

Next, as shown in FIG. 3, a wet etching process is conducted by using diluted hydrofluoric acid (DHF) to remove portions of the third dielectric layer 26, such as the top oxide layer of the ONO stack from the top of the gate structure 14 and the surface of the substrate 12. Thereafter, another wet etching process is carried out by using sulfuric peroxide mixtures (SPM) to remove portions of the second dielectric layer 24, such as the middle nitride layer of the ONO stack from the top of the gate structure 14 and the surface of the substrate 12. After portions of the third dielectric layer 26 and the second dielectric layer 24 are removed to expose a portion of the bottom oxide layer of the ONO stack, an offset spacer 30 is formed around the gate structure 14. The offset spacer 30 preferably includes a silicon nitride spacer 32 and a ONO stack 34 composed of an L-shaped first dielectric layer 36, an L-shaped second dielectric layer 38, and an L-shaped third dielectric layer 40.

Figure 4:
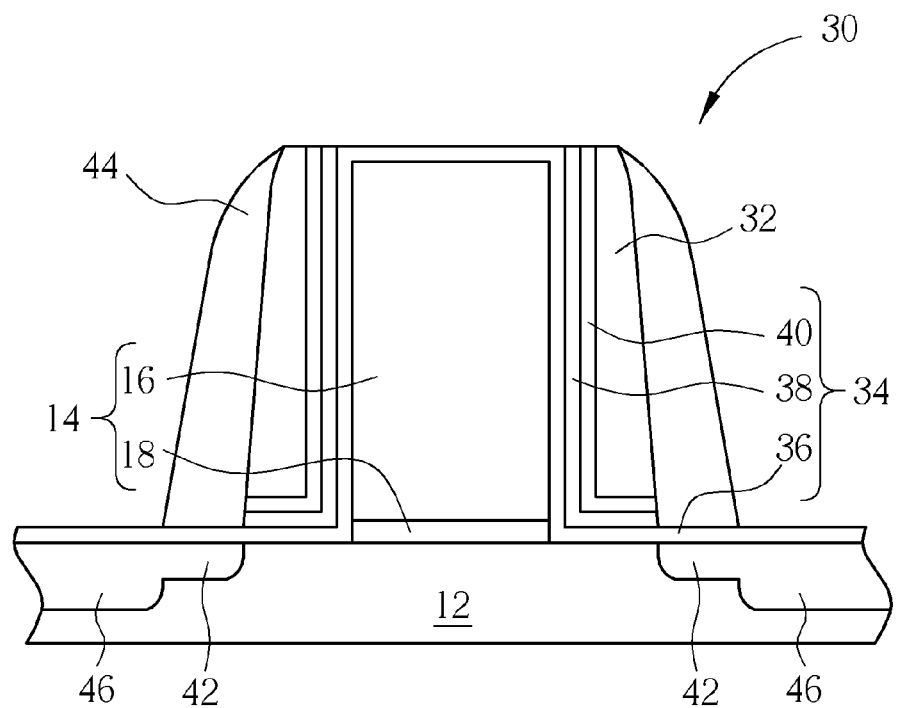

Next, as shown in FIG. 4, an ion implantation in is performed to implant either p-type dopants or n-type dopants into the substrate 12 adjacent to two sides of the offset spacer 30 for forming a lightly doped drain 42. After the lightly doped drain 42 is formed, a main spacer 44 is formed through a series of deposition and etching back process around the offset spacer 30, and another ion implantation is carried out to implant p-type dopants or n-type dopants into the substrate 12 adjacent to two sides of the main spacer 44 for forming a source/drain region 46. Despite only one main spacer 44 is revealed in this embodiment, the main spacer 44 could also be a composite spacer composed of silicon nitride and silicon oxide, which is also within the scope of the present invention. After the source/drain region 46 is formed, typical MOS structures such as salicides, interlayer dielectric layer, and contacts could be formed and as these structures are commonly known to those skilled in the art, the details of which are not explained herein for the sake of brevity.

Referring again to FIG. 4, a metal-oxide semiconductor (MOS) device structure is also disclosed. As shown in the figure, the MOS device includes a substrate 12; a gate structure 14 disposed on the substrate 12; an offset spacer 30 disposed around the gate structure 14, a lightly doped drain 42 disposed in the substrate 12 adjacent to two sides of the offset spacer 30, a main spacer 44 disposed around the offset spacer 30, and a source/drain region 46 disposed in the substrate 12 adjacent to two sides of the offset spacer 30.

In this embodiment, the offset spacer 30 is composed of an L-shaped ONO stack 34 and a silicon nitride spacer 32 sitting on the L-shaped ONO stack 34. The L-shaped ONO stack 34 preferably includes a first L-shaped silicon oxide layer 36, a first L-shaped silicon nitride layer 38, and a second L-shaped silicon oxide layer 40, in which the first L-shaped silicon oxide layer 36 is disposed to cover the substrate 12 and the sidewall and top of the gate structure 14 while the first L-shaped silicon nitride layer 38 and the second L-shaped silicon oxide layer 40 are only formed adjacent to two sides of the gate structure 14 and between the silicon nitride spacer 32 and the first L-shaped silicon oxide layer 36.

Overall, the present invention first deposits an ONON dielectric stack on a substrate and a gate structure, partially removes the top silicon nitride layer from the ONON dielectric stack through a plasma dry etching process, and then partially removes the first silicon oxide layer and second silicon nitride layer from the ONO stack through two separate wet etching processes for forming an offset spacer around the sidewall of the gate structure. As the ONO stack disposed under the top silicon nitride layer preferably has a thickness between 50 Angstroms to 70 Angstroms, charging from the plasma dry etching step is blocked by the ONO stack for protecting the gate insulating layer underneath as a portion of the top silicon nitride layer is removed, and as the first silicon oxide layer and second silicon nitride layer are partially removed through two separate wet etching processes, the profile of the bottom silicon oxide layer from the ONO stack is maintained throughout the fabrication and silicon loss in the substrate is also prevented.

Those skilled in the art will readily observe that numerous modifications and alterations of the device and method may be made while retaining the teachings of the invention.

What is claimed is:

1. A metal-oxide semiconductor (MOS) device, comprising:
   a substrate;
   a gate structure disposed on the substrate;
   an offset spacer disposed around the gate structure, wherein the offset spacer comprises an L-shaped ONO stack and a silicon nitride spacer sitting on the L-shaped ONO stack, and the L-shaped ONO stack comprises a first L-shaped silicon oxide layer, a first L-shaped silicon nitride layer, and a second L-shaped silicon oxide layer; and
   a lightly doped drain disposed in the substrate adjacent to two sides of the offset spacer.

2. The MOS device of claim 1, wherein the first L-shaped silicon oxide layer covers the substrate, sidewalls and a top of the gate structure.

3. The MOS device of claim 1, further comprising a main spacer disposed around the offset spacer.

4. The MOS device of claim 3, further comprising a source/drain region disposed in the substrate adjacent to two sides of the main spacer.

* * * * *